(12) United States Patent
Crick

(10) Patent No.: US 7,719,288 B2
(45) Date of Patent: May 18, 2010

(54) APPARATUS FOR DETECTING IMBALANCES IN A PAIRED LINE

(75) Inventor: Robert Crick, Rancho Santa Fe, CA (US)

(73) Assignee: Greenlee Textron Inc., Rockford, IL (US)

( * ) Notice: Subject to any disclaimer, the term of this patent is extended or adjusted under 35 U.S.C. 154(b) by 6 days.

(21) Appl. No.: 12/004,965

(22) Filed: Dec. 20, 2007

(65) Prior Publication Data

US 2008/0106270 A1 May 8, 2008

Related U.S. Application Data

(63) Continuation-in-part of application No. 11/977,572, filed on Oct. 25, 2007, now abandoned.

(60) Provisional application No. 60/854,290, filed on Oct. 25, 2006.

(51) Int. Cl.
*G01R 29/26* (2006.01)
*G01R 31/08* (2006.01)

(52) U.S. Cl. ........................ 324/613; 324/527

(58) Field of Classification Search ........... 324/613, 324/612, 600, 522–524, 527, 528, 539, 512; 379/21–24, 30
See application file for complete search history.

(56) References Cited

U.S. PATENT DOCUMENTS

| | | | | |
|---|---|---|---|---|
| 4,361,894 A | * | 11/1982 | Kurihara et al. | 375/326 |
| 4,517,531 A | * | 5/1985 | Tan et al. | 331/14 |
| 4,611,101 A | * | 9/1986 | Walter et al. | 379/29.03 |
| 5,157,336 A | * | 10/1992 | Crick | 324/613 |
| 5,239,696 A | * | 8/1993 | Balch et al. | 455/127.1 |
| 5,302,905 A | * | 4/1994 | Crick | 324/613 |
| 6,195,614 B1 | | 2/2001 | Kochan | |
| 6,363,123 B1 | * | 3/2002 | Balodis | 375/316 |
| 6,933,793 B2 | * | 8/2005 | Patterson et al. | 331/76 |
| 6,940,973 B1 | * | 9/2005 | Yeap et al. | 379/416 |
| 7,074,195 B2 | * | 7/2006 | Nelson et al. | 600/528 |

OTHER PUBLICATIONS

Product brochure for Sidekick Plus Advanced Cable Maintenance Test Set, from Tempo—A Textron Company, copyright date 2005 (2 pages).
Product brochure for Sidekick T&N, from Tempo—A Textron Company, copyright date 2002 (1 page).

* cited by examiner

*Primary Examiner*—Hoai-An D Nguyen
(74) *Attorney, Agent, or Firm*—Trexler, Bushnell, Giangiorgi, Blackstone & Marr, Ltd.

(57) ABSTRACT

A device for measuring and isolating noise-creating imbalances in a paired telecommunications line has an internal circuit which comprises a balanced center tapped termination consisting of precisely equal resistor pairs. The circuit includes an adjustable sine wave burst generator which generates a low voltage longitudinal ac signal that is transmitted across the balanced pathways. A differential amplifier in the circuit measures this difference and displays it in units of noise or balance. The output of the differential amplifier is transmitted to an analog-to-digital converter. A microprocessor collects the samples in an array, and filters the results for presentation on a display. Advantageously, the microprocessor provides for adjustable and selectable bandpass filtering. Preferred bandpass filtering preferably occurs at 1 kHz, 200 KHz, 1 MHz, and 5 MHz with a preferred frequency bandpass of 3 harmonics to provide bandpass ranges of 200-600 KHz, 1-3 MHz, and 5-15 MHz, respectively, and a bandpass of 3 Hz at 1 kHz.

24 Claims, 2 Drawing Sheets

APPARATUS FOR DETECTING IMBALANCES IN A PAIRED LINE

RELATED APPLICATIONS

This application is a continuation-in-part of U.S. patent application Ser. No. 11/977,572 filed on Oct. 25, 2007 now abandoned which is hereby incorporated by reference. U.S. patent application Ser. No. 11/977,572 claims the benefit of U.S. provisional application Ser. No. 60/854,290 filed on Oct. 25, 2006 which is hereby incorporated by reference.

BACKGROUND OF THE INVENTION

The present invention relates generally to the detection of imbalances in a paired line. More particularly the present invention relates to the accurate measurement of pair balance in the presence of a high level of power influence or other interference. More particularly it relates to the detection of small pair imbalances that can affect the higher frequencies communicated by ADSL and VDSL circuits but may not be detectable with voiceband tests.

Paired lines are a conventional means of carrying telecommunications transmissions. A paired line is made up of two balanced conductors individually insulated and twisted together. Paired lines are typically bunched together in a cable termed a paired cable which contains up to one hundred or more paired lines, wherein each paired line is capable of independently carrying telecommunications signals. Paired lines are generally effective telecommunications carriers. However, it is not unusual for noise to occur in paired lines which is extremely disruptive to the clarity of the transmitted signal.

When noise is reported in a paired telecommunications line, correction of the condition requires confirming the presence of the noise in the line by measuring its level and then isolating and locating the noise source for purposes of eliminating it. There are a wide range of noise sources for which detection is desirable since virtually any condition which can cause an imbalance between two conductors of a paired line can result in noise. Among the causes are series resistance faults, shunt resistance faults, cross faults, shunt capacitance faults, unbalanced series inductance, and power influence. Series resistance faults occur when there is an open in a line, often resulting from a corroded joint. Shunt resistive faults occur when another body grounds a paired line. Cross faults occur when there is communication between adjacent paired lines in a cable. Shunt capacitance faults occur when one conductor of a pair is slightly longer than the other conductor, and the longer conductor possesses a higher capacitance to ground than the shorter conductor. Unbalanced series inductance occurs when only one half of a load coil is connected to a paired line at some point along the length of the line. Power influence is induced voltage from an ac power source adjacent the paired line. Unlike the above-recited causes of imbalance, power influence imbalance can occur even when the paired line is free of faults and appears balanced in the absence of the power influence.

Power influence, which as noted above is induced voltage from line to ground, most commonly occurs when the paired line is near a power line. In the United States, the power line frequency is typically 60 Hz, but power influence can likewise result from other power line frequencies, including 50 Hz, as typically found in many other parts of the world. Power influence can create unique problems for noise detection when it occurs in conjunction with a fault. For example, a series resistance fault may only produce a high level of noise when accompanied by a high power influence. Therefore, a noise caused by the fault may be observed by a user at a time of high power demand on a nearby power line, but when a repairman is dispatched to the site, the power demand and correspondingly the power influence may have diminished so that the noise resulting from the fault alone is no longer detectable by conventional detection devices. Accordingly, such a fault is very difficult to locate and repair.

Another detection problem results from the fact that power influence signals often do not create large longitudinal current flow. Such flow is necessary to detect series resistance faults because longitudinal current flow through a series resistance fault produces a voltage imbalance in the paired line which can be measured metallically. However, because conventional passive detection devices lack the ability to independently generate longitudinal current flow, they accordingly may fail to detect such faults where power influence is relied upon to generate longitudinal current flow.

Various attempts have been made to detect imbalances in paired lines. For example, the "Stress Test" has become the accepted name for the test described in U.S. Pat. Nos. 5,157,336 and 5,302,905, which provided a new way to test all cable pairs, working or dry, for proper balance. This test has become the telephone industry standard for determining the usability of a pair before placing it in service, and for isolating pair balance trouble to the source. A particular benefit of the Stress Test is in testing dry pairs before placing them into service as the test identifies "killer pairs" that tested good by previous methods yet tend to go bad within 48 hours after being placed in service.

Apparatus implementing the above Stress Test sent out a simplex (both sides of the pair excited equally with respect to ground) "Stress" tone through a balanced center tapped termination. Any unbalance on the pairs converted the simplex tone to metallic (across the conductors) which was amplified and filtered through a C Message filter. The filter output was converted to display either stressed noise or stressed balance, with stressed noise in dBrnC being the most popular.

The Stress Test simplex stress tone acted as an artificial "Power Influence" signal, permitting any pair's balance to be tested, even those pairs having too little power influence to allow a normal Longitudinal Balance reading. Longitudinal Balance readings expressed the difference between passive Power influence and Noise Metallic readings on the pair and thus did not place simplex excitation on the pair. The Stress Test internal termination to ground caused longitudinal current flow on the pair, revealing series resistance unbalances invisible to the Longitudinal Balance test. The pair can be tested from either end and does not require a termination in the C.O.

A problem exists with the above Stress Test in that Induction noise induced onto the tested pair in the voice band adds to the test signal converted from simplex to metallic by any unbalance on the pair causing high stressed noise inferring poor pair balance when balance is not the source. In addition, high Power Influence can swamp out the applied simplex stress voltage causing erroneous high stressed noise readings. In areas with high power influence approaching or above the applied "Stress" voltage, the Stress Test will erroneously read bad on good pairs. Thus, on noisy pairs you may not be measuring stressed noise, but induced noise converted from high Power Influence (50/60 Hz harmonics) on the pair due to the wideness of the C Message filter. This erroneous reading can cause technicians to try to improve pair balance rather than correcting high Power Influence, the true cause of the bad Stress Test indication. Therefore a "Voiceband Stress Test" is needed that can indicate the true stress balance of a pair in the voiceband with the presence of normal or high power influence.

Furthermore, the Stress Test as described above applies a simplex tone, in the voiceband typically near 1 kHz and indicates the balance of the pair at that frequency. Pairs that stress bad in the voiceband usually will not perform in the DSL band. A good Stress Test reading however, does not necessarily indicate the pair will perform well in the DSL band. Minor capacitive or resistive unbalances that do not give a bad reading in the voiceband, can be service-effecting in the DSL bands.

Therefore, a test is needed that performs like the Stress Test in the DSL band, so it can be used to isolate service effecting DSL problems by technicians already familiar with using the Stress Test. Preferably, this test would quickly give a numeric readout allowing a confirmation that the pair is within parameters for service. It would be desirable if the test were faster than a TDR reading, not requiring the technician to interpret whether a TDR squiggle seen at the far end of a pair after he turns up the gain will affect service. Furthermore, the improved test apparatus would work on an in-service DSL circuit where a TDR will not work.

SUMMARY OF THE INVENTION

Briefly, in accordance with the invention, I provide an apparatus and method for accurately detecting imbalances in a paired line in the presence of high power influence, and more particularly for the detection of more subtle imbalances that are only noticeable at frequencies in the DSL bands.

The detecting device of the present invention can be in a self contained field portable unit consisting of a housing containing the internal measuring circuit and battery with a plurality of external leads extending from the housing. In another embodiment the measuring circuit can be included inside a multi-purpose test unit that combines the present test with other tests and displays the results on a common screen used to display this and other tests.

The internal circuit comprises a pair of substantially balanced ac current outlet pathways which extend in parallel from an ac current source. In a preferred embodiment, balance is achieved by providing a corresponding balanced resistor in each balanced outlet pathway. The ac current source is a sine wave burst generator which supplies a burst of 100 or less cycles of sine wave before pausing, and even more preferably, the sine wave burst generator produces only a single sine wave pulse before pausing. A ground pathway is connected to the oscillator and provides an earth ground for the device across the ground lead. A display is provided to visually display the output signal of the differential amplifier as a meaningful noise or balance measurement. Operating power for the device is provided by a direct current battery.

The internal circuit further comprises a differential amplifier which is connected to the measuring leads across a pair of voltage inlet pathways. The output of the differential amplifier is transmitted to an analog-to-digital converter which samples the voltage. The digital signal produced by the A/D converter is processed by a microprocessor which also provides for adjustable and selectable bandpass filtering. The processing results of the microprocessor is produced on a display screen.

If there is any imbalance between the two conductors, metallic voltage signals will be generated which will be different between the two conductors. Accordingly, the voltage inlet pathways will receive the different voltages from the two conductors and feed the voltages to the differential amplifier, A/D converter and microprocessor which measures the level of difference. This voltage difference is displayed to the operator in units of noise or balance.

It is thus an object of the present invention to provide an improved apparatus for detecting and isolating noise-creating imbalances in a paired line that would quickly give a numeric reading confirming that a pair was within, or not within, parameters for service, with or without the presence of high power influence.

It is also an object of the present invention to provide an improved apparatus for detecting and isolating noise-creating imbalances in a paired line operating at various frequencies including the ADSL and VDSL bands.

DETAILED DESCRIPTION OF PREFERRED EMBODIMENTS

Figure 1:
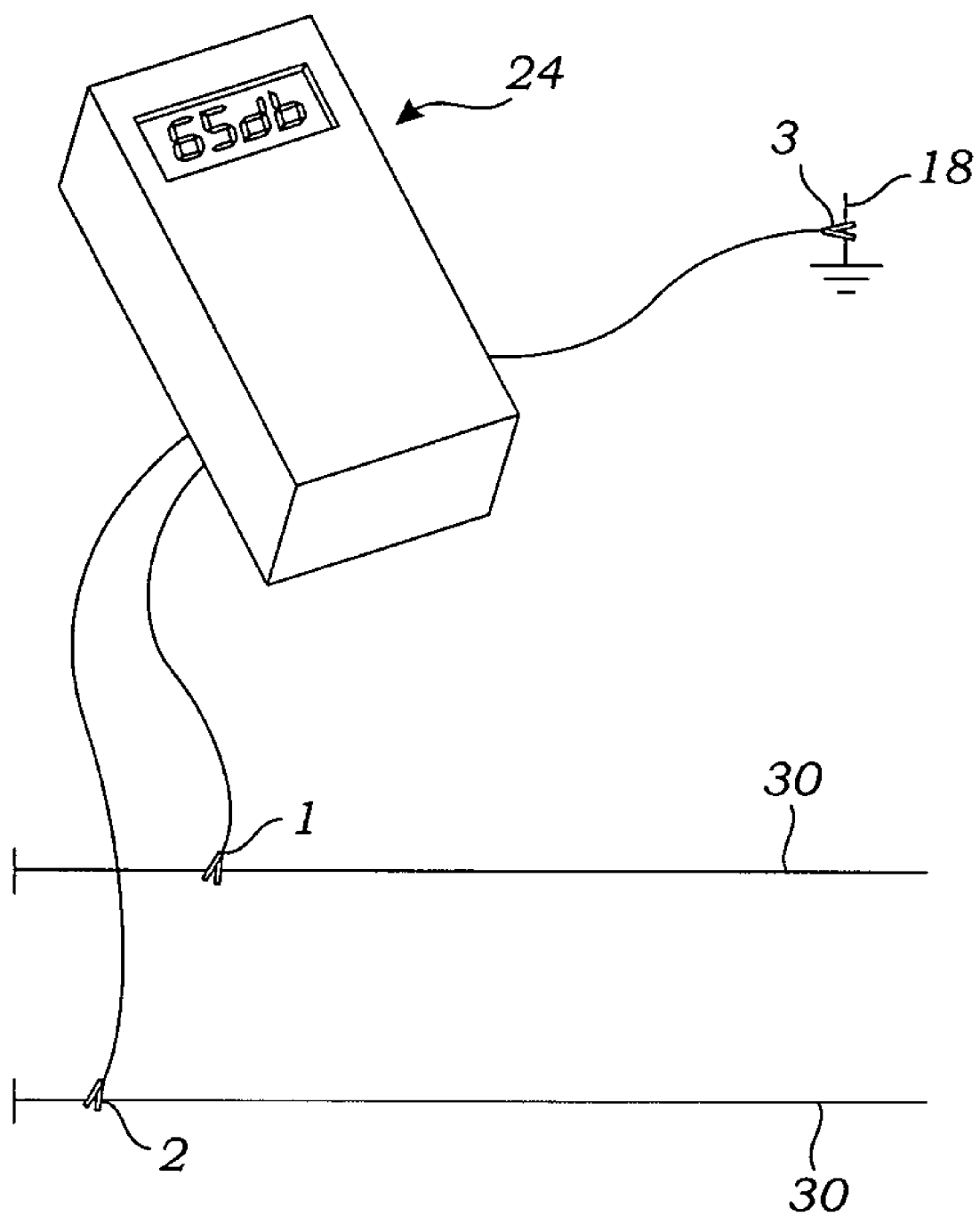
FIG. 1 is a perspective view of a hand-held apparatus in which the present invention can be incorporated.

While the present invention is susceptible of embodiment in various forms, as shown in the drawings, hereinafter will be described the presently preferred embodiments of the invention with the understanding that the present disclosure is to be considered as an exemplification of the invention, and is not intended to limit the invention to specific embodiments illustrated.

Figure 2:
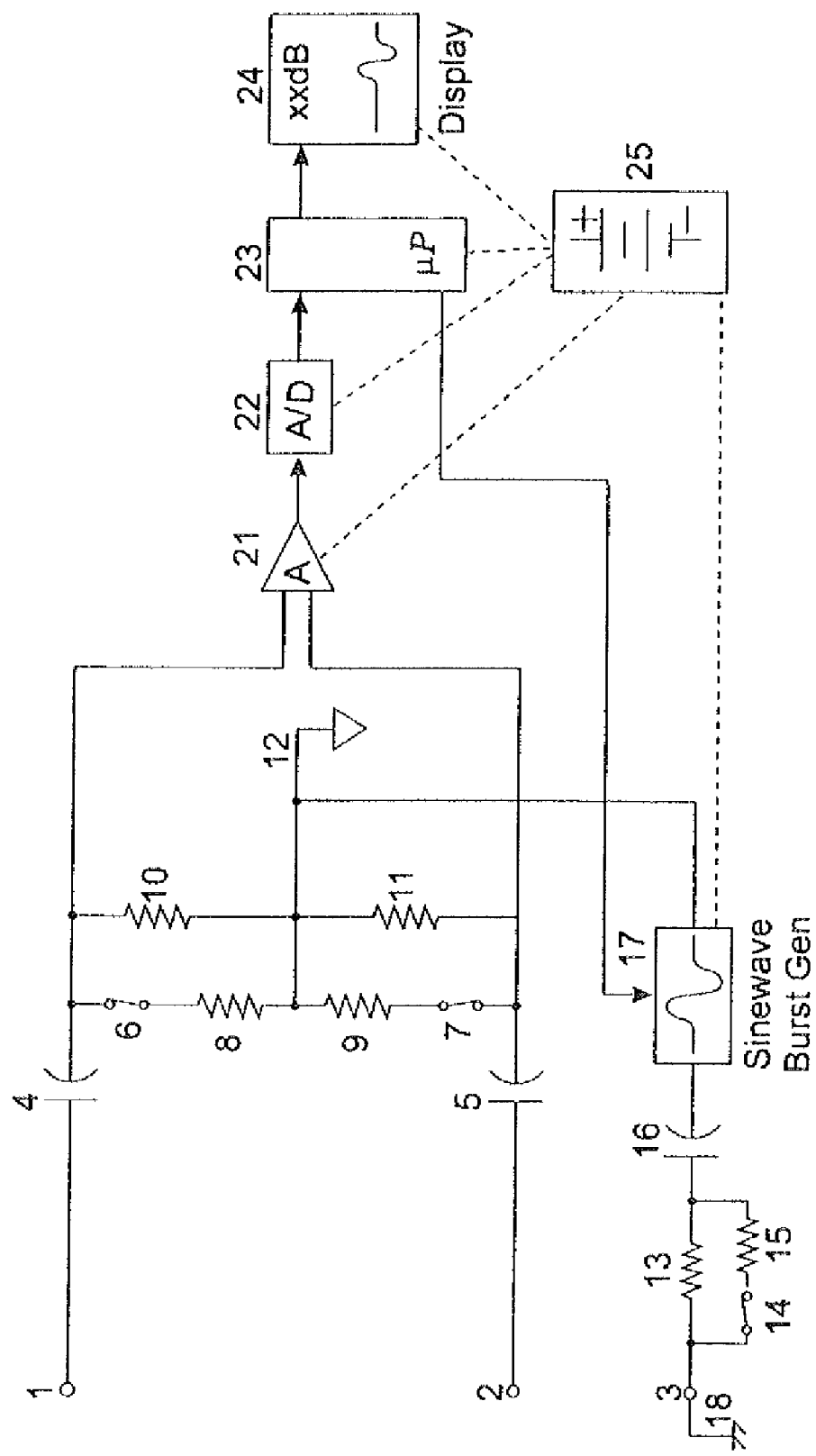
FIG. 2 is a diagram of the circuitry of the present invention.

With reference to FIGS. 1 and 2, the internal circuit comprises a balanced center tapped termination consisting of precisely equal resistor pairs whose purpose is to drive precisely equal test currents into both sides of the tested pair with respect to ground. This is commonly termed as simplex excitation of the pair. Contacts 1 and 2 are typically test clips that are removably connected to the two conductors 30 of the tested pair. Contact 3 is typically a test clip removably connected to earth ground.

As shown in FIG. 2, the circuit of the present invention may include switches 6, 7, and 14, shown in a closed state. The values of resistors 8 and 9 are chosen to be precisely balanced as are resistors 10 and 11. Resistors 8, 9, 10, and 11 are all returned to circuit reference 12, which represents a floating reference not necessarily available in the circuit. With switch 6 closed, resistors 8 and 10 are paralleled. With switch 7 closed, resistors 9 and 11 are paralleled. Paralleled resistors 8 and 10 couple from circuit reference 12 through capacitor 4 and contact 1 to one conductor of the tested pair. Paralleled resistors 9 and 11 couple from circuit reference 12 through capacitor 5 and contact 2 to the other conductor of the tested pair.

Since resistors 8 and 9 are precisely balanced as are resistors 10 and 11, their parallel combination will also be precisely balanced. The paralleled resistors form a balanced center tapped network whose center tap is represented by circuit ground 12.

Capacitors 4 and 5 are chosen to present precisely equal impedance to all test frequencies while not passing DC voltage that can be present on the pair. Therefore contacts 1 and 2 see precisely equal impedances through a balanced center tapped network back to circuit reference 12. As a result of this balanced center tapped network, when circuit reference 12 is driven with respect to earth ground by a sine wave burst generator 17, precisely equal currents will be driven into the two conductors of a balanced tested pair. Any imbalance on the pair will create a metallic voltage between its two conductors and this voltage is amplified and processed to be read out by the display 24.

The sine wave burst generator 17 is capable of generating sine waves at multiple frequencies, typically 1 KHz for the Voiceband Stress Test, 200 KHz and 1 MHz for the ADSL Stress Test, and 1 MHz and 5 MHz for the VDSL Stress Test. These are representative frequencies and a wide range of frequencies can be used within the spirit of this invention. In addition to continuous sine waves, the sine wave burst generator can be strobed to deliver a single full cycle of a sine wave (a pulse) or a strobe of multiple whole cycles (a burst), and these pulses/bursts are typically repeated at a strobe rate. Preferably, the sine wave burst generator produces bursts of 100 cycles for the Voiceband Stress Test. For the DSL Stress Tests the sine wave burst generator produces only a burst of 10 or less cycles of sine wave before pausing, and even more preferably, the sine wave burst generator produces only a single sine wave pulse before pausing. The duration of the pause is selected to allow all pulse returns to clear the longest pair to be tested during the pause.

A sine wave cycle, beginning and ending at zero crossings, has the advantage that it produces no subharmonics below its fundamental frequency, and no artifacts at the strobe rate frequency or its harmonics. Thus for sine wave frequencies above the voiceband there will be no audible frequencies generated in the voiceband by the strobing process, and no interference with conversation on the pair. This contrasts with raised cosine pulses typical of a standard TDR, which produce loud audible sounds at the strobe rate and harmonics of that rate.

Strobed sine waves can also be lowpass filtered above the third or fifth harmonic and still have useable resulting waveshapes. Thus interference in the DSL bands from these pulses can be managed, since the pulse spectrum can be limited to controllable bands. Proper filtering will allow testing by sending pulses simplex on a working pair without knocking down DSL or voice service.

One side of sine wave burst generator 17 is coupled through capacitor 16, then through resistors 13 and 15 in parallel due to the closed switch 14, to contact 3 which is typically a test clip that is removably connected to earth ground 18. The other side of sine wave generator 17 is connected to circuit reference 12. As a result of this connection, sine wave burst generator 17 will impose voltage pulses between earth ground and circuit reference 12, resulting in sine wave current bursts flowing from circuit reference 12 through the balanced center tapped termination onto both conductors of the pair connected to contacts 1 and 2.

In the ease of sending megahertz pulses for testing DSL pairs, the impedance between the conductors, the metallic impedance, should be matched to the impedance of the tested pair, about 125 ohms. The parallel combination of resistors 8 and 10 and that of resistors 9 and 11 form the balanced center tapped termination so each parallel resistor combination should be 62.5 ohms. The two sides of the balanced center tapped termination appear in parallel to simplex pulses so the simplex impedance would be 31.25 ohms. In some cases a higher simplex impedance would be desirable to match the cable, so the parallel combination of resistors 13 and 15 would be chosen so it will add to the balanced center tapped termination simplex impedance to achieve the desired overall simplex impedance for launching simplex sine wave bursts.

In the case of voiceband testing, it may be desirable to terminate with an impedance of 600 or 900 ohms. In this case switches 6 and 7 are opened in order to have resistors 10 and 11 provide the desired metallic impedance. Furthermore, switch 14 is opened in order to have resistor 13 build out to the desired simplex impedance. Thus, resistors 10, 11, and 13 are first chosen to provide the desired voiceband impedance. Then resistors 8, 9, and 15 are chosen to give the desired high frequency impedance when switches 6, 7, and 14 are closed.

Strobed bursts can be expanded to a continuous sine wave if desired for testing, or the strobe width can be reduced to deliver single sine cycle pulses if so desired. For the Voiceband Stress Test a continuous non-strobed sine wave can be sent in a similar fashion as in the older Stress Test. For the DSL Stressed Test or the Balance TDR display, single cycles would be preferred.

As illustrated in FIG. 2, the circuit of the present invention includes a differential amplifier 21, an analog-to-digital converter 22, a microprocessor 23, and display 24. Amplifier 21 is a balanced input amplifier responsive to all test frequencies to be impressed onto the pairs up to tens of Megahertz in some cases. It has a very high common mode rejection ratio in order to keep the simplex bursts from appearing at its output. The amplifier 21 output, in turn, connects to the input of the analog-to-digital (A/D) converter 22. The A/D converter 22 is capable of sampling the voltage at the rate necessary for computation of the displayed results.

Microprocessor 23 controls the A/D converter, collects the samples in an array, and filters the results for presentation on the display 24. Advantageously, the microprocessor provides for adjustable and selectable digital bandpass filtering. At 1 kHz the preferred bandpass is 3 Hz. Preferred bandpass filtering occurs at 200 KHz, 1 MHz, and 5 MHz with a preferred frequency bandpass of 3 harmonics to provide bandpass ranges of 200-600 KHz, 1-3 MHz, and 5-15 MHz, respectively. These frequencies and bandpass ranges are considered preferred, and additional frequencies and passbands, such as 5 or even 7 harmonics may be employed within the spirit of the invention.

As illustrated in FIGS. 1 and 2, the circuit includes a battery 25 providing power to sine wave burst generator 17, differential amplifier 21, analog-to-digital converter 22, microprocessor 23 and display 24. The display 24 would typically be an LCD display, and it preferably includes graphical capability if a display of waveforms is desired.

In operation, the circuit can be employed for locating imbalances at various frequencies in various paired line constructions 30. For example, in a first embodiment, one adjusts the microprocessor 23 to provide a low frequency bandpass, such as a 3 Hz bandpass filter which will give a reduction of 31 to 1 of any power harmonics present on the pair. The simplex excitation tone frequency must be positioned between the 60 Hz power harmonics so as not to have any power harmonic fall within the filter passband. Thus if the test frequency is positioned half way between 60 Hz harmonics, its bandwidth should be less than 60 Hz so as to adequately attenuate the 60 Hz harmonics immediately above and below the test frequency. 1 kHz does not lie half way between the 960 Hz and 1020 Hz harmonics but the 3 Hz stated preferred bandwidth will adequately attenuate the 1020 Hz closest harmonic.

This Voiceband Stress Test with good filtering can reliably indicate pair stressed balance or stressed noise even with high power influence on the pair. It will eliminate the need for comparing readings on other pairs in the cable in order to qualify whether a Stress Test reading is being corrupted by power influence. The Voiceband Stress Test will give an accurate indication of pair balance in the voice band in any situation, and is an improvement of the older Stress Test.

In a second application of the invention, a very quick test of a working DSL or data line can be made by applying a stressed noise tone at a frequency in the DSL band simplex on the pair 30 through a balanced termination and monitoring the conversion to metallic in order to display balance. This balance test can be bridged on anywhere along the line 30 and will quickly identify intermittent lines with high joints (series resistance faults) or capacitance unbalances without taking them out of service. In addition this test can be used on dry pairs or nonworking DSL circuits.

A fixed frequency is applied simplex to the pair through a balanced termination, to produce a minimal interference in the DSL modems. It could be positioned near 200 kHz at the quiet spot between the upstream and downstream bands or at any other point that would produce minimum interference with the modems. It would also be positioned between 60 Hz harmonics For VDSL, circuits a higher test frequency can be selected. The balanced termination would have a high impedance Bridging Mode when connected between the modems, and a pair impedance matching Terminate mode for testing out-of-service pairs from one end.

The displayed metallic signal (DSL stressed noise or balance) would be from a narrow band coherent filter to avoid displaying the DSL traffic. The readout would be either Stressed Noise or Stressed Balance. On lines where the DSL modems are not active, or between modem training polls, frequencies that could interfere with modem traffic can be sent. In this case, the transmitted pulses will be repeated at successively shorter pulsewidths in order to scan through a range of transmitted frequencies. As a result, unbalanced jumpers or taps can be emphasized by essentially sweeping the frequency of the transmitted simplex pulses.

In a third application of the invention, the circuit is utilized to detect imbalances at the ADSL band. At frequencies in the upper ADSL band, and to a greater extent in the upper VDSL band, pair attenuation will cause service affecting imbalances at the far end of the pair to be much weaker when they return. Some will be so attenuated as to be overlooked at the near end making the test unusable unless corrected.

To compensate for attenuation, instead of simplex exciting the pair with a sine wave in the DSL band, we will apply strobed bursts of the test sine wave as simplex excitation. These bursts could be from a single cycle to tens of cycles. The maximum number of cycles is determined by the time delay of the length of the pair and the method of display.

Thus the ADSL Stress Test or VDSL Stress Test will operate in a send/listen format similar to that of a TDR. If a single cycle pulse is sent simplex, the metallic receive channel A/D will be sampled at for example 8 samples per cycle and the samples stored in the first row of an array whose width equals the time delay of the longest line to be tested. Each successive stored sample would represent a greater delay from the pulse transmission time. A second pulse is sent and the resulting reflections are stored in the second row of the array, and the process repeats.

Several rows of the array are column averaged and the average stored in an Averaged Row. The stored points in this row can be painted on a graphical display to produce a filtered return pulse waveform. This waveform would resemble a TDR trace with a very wide transmit pulse. Increasing the number of samples per cycle improves the resolution, reducing the number of samples allows a slower processor to be used. The samples in the Averaged Row are then multiplied by attenuation correction multipliers to correct for pair attenuation at the frequency of the pulse.

The attenuation correction multipliers ramp upward with distance (time) from the transmit pulse, depending on the attenuation of the gauge chosen by the user for the pair. The corrected values are stored in a Corrected Row which would be the ideal row to paint to a graphical display representing a simplex to metallic pulse return. After correction, an imbalance of a given impedance will give the same amplitude return from the far end of the pair as from the near end.

The peak value from the Corrected Row is then displayed numerically as DSL Stressed Noise. Alternatively, this number can be compared with the transmit amplitude to display DSL Stressed Balance. To accommodate all forms of ADSL and VDSL, several test frequency bands will be selectable.

Advantageously, a rough numerical distance reading can be computed from the above array data, which will tell if the fault is near or far. The array would be scanned and the displayed distance would be computed from the time delay from simplex pulse transmit to receipt of the strongest metallic return pulse. Thus a rough digital distance reading can be part of the display. The use of sine wave pulses enhances the accuracy of this measurement as they have a zero crossing that is easy to accurately locate with the microprocessor.

While several particular forms of the invention have been illustrated and described, it will be apparent that various modifications can be made without departing from the spirit and scope of the invention. Accordingly, it is not intended that the invention be limited except by the following claims.

I claim:

1. An apparatus for measuring imbalance in a paired line comprising:
    a first contact engagable with a first conductor of said paired line;
    a second contact engagable with a second conductor of said paired line;
    measuring means in electrical communication with said first and second contacts for providing a metallic voltage signal generated by an imbalance between said first conductor and said second conductor;
    a first voltage inlet pathway across which said measuring means electrically communicates with said first contact;
    a second voltage inlet pathway across which said measuring means electrically communicates with said second contact;
    a first balanced pathway in electrical communication with said first contact;
    a second balanced pathway in electrical communication with said second contact, said first balanced pathway substantially electrically balanced with said second balanced pathway;
    an alternating current source electrically connected to said first contact across said first balanced pathway and to said second contact across said second balanced pathway configured to provide a burst of an alternating current signal at a predetermined frequency to said first and said second conductors of said paired line;
    a microprocessor configured to initiate said burst of said alternating current signal;
    a ground pathway connected to said alternating current source; and
    wherein said measuring means provides said metallic voltage signal in response to said alternating current signal and said microprocessor is further configured to receive data relating to said metallic voltage signal provided by said measuring means.

2. The apparatus for measuring imbalance in a paired line of claim 1 wherein said measuring means comprises:
    a differential amplifier for outputting the difference in metallic voltage signals generated by an imbalance between said first conductor and said second conductor;

an analog-to-digital converter for converting the analog output of the differential amplifier into a digital signal; and wherein said microprocessor receives the digital signal produced by the analog-to-digital converter.

3. The apparatus for measuring imbalance in a paired line of claim 1 further comprising a band pass filter having a passband that includes said predetermined frequency.

4. The apparatus for measuring imbalance in a paired line of claim 3 wherein said passband further includes a plurality of harmonies of said predetermined frequency.

5. The apparatus for measuring noise in a puffed line of claim 1, wherein said ground pathway includes ground minimizing means for substantially minimizing flow of power influence current to ground.

6. The apparatus of claim 1, wherein the predetermined frequency of the alternating current signal is selected to be between an upstream frequency of the DSL service to be provided on the pair and a downstream frequency of the DSL service to be provided on the pair.

7. The apparatus of claim 1, wherein the predetermined frequency of the alternating current signal is selected from a range of approximately 200 KHz to approximately 35 MHz.

8. The apparatus of claim 1, wherein the predetermined frequency of the alternating current signal is selected from the group of 200 KHz, 1 Mhz, and 5 MHz.

9. The apparatus of claim 1, further comprising a narrow band filter having a passband centered on said predetermined frequency.

10. The apparatus of claim 1, wherein said burst initiated by said microprocessor provides a single cycle of said alternating current signal.

11. The apparatus of claim 1, wherein said burst initiated by said microprocessor provides up to one hundred cycles of said alternating current signal.

12. The apparatus of claim 10 wherein said microprocessor is further configured to determine a time delay from initiation of said alternating current signal burst to receipt of said metallic voltage data.

13. The apparatus of claim 12, wherein said microprocessor is configured to apply attenuation correction to said data, based on said determined time delay.

14. The apparatus of claim 1, wherein said microprocessor is further configured to apply attenuation correction to said data, based upon the frequency of said alternating current signal.

15. The apparatus of claim 1, wherein said microprocessor is further configured to apply attenuation correction to said data, based upon the gauge of said paired line.

16. An apparatus for measuring imbalance in a paired line comprising:
 a first contact engagable with a first conductor of said paired line;
 a second contact engagable with a second conductor of said aired line;
 measuring means in electrical communication with said first and second contacts for providing a metallic voltage signal generated by an imbalance between said first conductor and said second conductor;
 a first voltage inlet pathway across which said measuring means electrically communicates with said first contact;
 a second voltage inlet pathway across which said measuring means electrically communicates with said second contact;
 a first balanced pathway in electrical communication with said first contact;
 a second balanced pathway in electrical communication with said second contact, said first balanced pathway substantially electrically balanced with said second balanced pathway;
 an alternating current source electrically connected to said first contact across said first balanced pathway and to said second contact across said second balanced pathway configured to provide a burst of an alternating current signal at a predetermined frequency line to said first and said second conductors of said paired line;
 a ground pathway connected to said alternating current source;
 at least one switch for altering the impedance of said first and second balanced pathways to provide matching of the impedance of the paired line to the impedance between the first and second conductors; and
 wherein said metallic voltage signals are provided in response to said burst of said alternating current signal.

17. The apparatus of claim 16, wherein the apparatus can be bridged to the paired line without substantially disrupting the impedance between the first and second conductors of the paired line.

18. An apparatus for measuring imbalance in a paired line comprising:
 a first contact engagable with a first conductor of said paired line;
 a second contact engagable with a second conductor of said paired line;
 measuring means in electrical communication with said first and second contacts for providing a plurality of metallic voltage signals generated by an imbalance between said first conductor and said second conductor;
 a first voltage inlet pathway across which said measuring means electrically communicates with said first contact;
 a second voltage inlet pathway across which said measuring means electrically communicates with said second contact;
 a first balanced pathway in electrical communication with said first contact;
 a second balanced pathway in electrical communication with said second contact, said first balanced pathway substantially electrically balanced with said second balanced pathway;
 an alternating current source electrically connected to said first contact across said first balanced pathway and to said second contact across said second balanced pathway configured to provide a plurality of bursts of an alternating current signal at a predetermined frequency to said first and said second conductors of said paired line;
 a microprocessor configured to initiate said plurality of bursts of said alternating current signal,
 a ground pathway connected to said alternating current source; and
 wherein said measuring means provides each of said plurality of metallic voltage signals in response to each of said bursts, and said microprocessor is configured to receive data relating to each of said plurality of metallic voltage signals.

19. The apparatus of claim 18, wherein said received data is stored in an array provided, by said microprocessor and including a plurality of rows and columns.

20. The apparatus of claim 19, wherein each said row of said array includes a plurality of magnitude samples of said metallic voltage signals measured at a plurality of elapsed times from initiation of said burst, wherein each said row corresponds to one of said plurality of bursts, and wherein each said column of said array includes magnitude samples from each said burst relating to one of said plurality of elapsed times.

21. The apparatus of claim 20, wherein said microprocessor is further configured to provide column averages of magnitude samples in a plurality of said rows in said array and multiply said column averages by an attenuation correction multiplier to provide corrected magnitude samples.

22. The apparatus of claim 21, wherein said microprocessor is further configured to provide a graphical display of said corrected magnitude samples, and wherein said corrected magnitude samples are represented on a vertical axis of said display and said time elapsed associated with said corrected magnitude samples is represented on a horizontal axis of said display.

23. The apparatus of claim 21, wherein said microprocessor is further configured to scan said corrected magnitude samples to determine and display the largest corrected magnitude sample.

24. The apparatus of claim 23, wherein said microprocessor is further configured to determine and display a distance to the fault relating to said largest corrected magnitude sample based on a time elapsed associated with said largest corrected magnitude sample.

* * * * *